United States Patent
Sato et al.

(10) Patent No.: US 9,764,443 B2
(45) Date of Patent: Sep. 19, 2017

(54) METHOD OF PRODUCING CARRIER FOR USE IN DOUBLE-SIDE POLISHING APPARATUS AND METHOD OF DOUBLE-SIDE POLISHING WAFERS

(71) Applicant: SHIN-ETSU HANDOTAI CO., LTD., Tokyo (JP)

(72) Inventors: Kazuya Sato, Nasushiobara (JP); Yuki Tanaka, Nishigo-mura (JP); Syuichi Kobayashi, Shirakawa (JP); Kenji Iha, Uruma (JP); Toshinari Kinjo, Uruma (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 79 days.

(21) Appl. No.: 14/761,554

(22) PCT Filed: Jan. 15, 2014

(86) PCT No.: PCT/JP2014/000134
§ 371 (c)(1),
(2) Date: Jul. 16, 2015

(87) PCT Pub. No.: WO2014/125759
PCT Pub. Date: Aug. 21, 2014

(65) Prior Publication Data
US 2015/0375363 A1    Dec. 31, 2015

(30) Foreign Application Priority Data

Feb. 13, 2013    (JP) .................................. 2013-025515
Dec. 3, 2013     (JP) .................................. 2013-250319

(51) Int. Cl.
B24B 37/28    (2012.01)
B24B 7/22     (2006.01)
(Continued)

(52) U.S. Cl.
CPC ................ *B24B 37/28* (2013.01); *B24B 7/17* (2013.01); *B24B 7/228* (2013.01); *B24B 7/241* (2013.01);
(Continued)

(58) Field of Classification Search
CPC ......... B24B 7/228; B24B 7/241; B24B 37/08; B24B 37/28; B24B 7/17; H01L 21/304; H01L 21/30625; H01L 21/673
See application file for complete search history.

(56) References Cited

U.S. PATENT DOCUMENTS 4,739,589 A * 4/1988 Brehm .................... B24B 37/08
                                                    451/269
5,899,743 A * 5/1999 Kai ........................ B24B 37/042
                                                    257/E21.214
(Continued)

FOREIGN PATENT DOCUMENTS

CN    101059033 A    10/2007
CN    100481341 C     4/2009
(Continued)

OTHER PUBLICATIONS

May 20, 2016 Office Action issued in Taiwanese Patent Application No. 103102728.
(Continued)

*Primary Examiner* — Timothy V Eley
(74) *Attorney, Agent, or Firm* — Oliff PLC

(57) ABSTRACT

A method of producing a carrier for use in a double-side polishing apparatus, the method including engaging an insert with a holding hole formed in a carrier body and sticking the insert to the holding hole, the carrier body being configured to be disposed between upper and lower turn tables to which polishing pads are attached of the double-side polishing apparatus, the holding hole being configured
(Continued)

to hold a wafer during polishing, the insert being configured to contact an edge of the wafer to be held, the method including: performing a lapping process and a polishing process on the insert; engaging the insert subjected to the lapping process and the polishing process with the holding hole of the carrier body; and sticking and drying the engaged insert while applying a load to the insert in a direction perpendicular to main surfaces of the carrier body.

16 Claims, 13 Drawing Sheets

(51) Int. Cl.
B24B 7/24 (2006.01)
B24B 7/17 (2006.01)
B24B 37/08 (2012.01)
H01L 21/304 (2006.01)
H01L 21/673 (2006.01)

(52) U.S. Cl.
CPC ............ *B24B 37/08* (2013.01); *H01L 21/304* (2013.01); *H01L 21/673* (2013.01)

(56) References Cited

U.S. PATENT DOCUMENTS

| | | | | |
|---|---|---|---|---|
| 6,709,981 | B2* | 3/2004 | Grabbe | B24B 37/0056 |
| | | | | 257/E21.228 |
| 9,050,698 | B2* | 6/2015 | Yasuda | B24B 37/28 |
| 9,327,382 | B2* | 5/2016 | Ueno | B24B 37/28 |
| 2005/0019987 | A1 | 1/2005 | Waldman et al. | |
| 2008/0166952 | A1 | 7/2008 | Ueno | |
| 2008/0318493 | A1* | 12/2008 | Aida | B24B 37/08 |
| | | | | 451/36 |
| 2011/0104995 | A1 | 5/2011 | Ueno et al. | |
| 2015/0217425 | A1* | 8/2015 | Sasaki | B24B 37/08 |
| | | | | 451/57 |

FOREIGN PATENT DOCUMENTS

| | | |
|---|---|---|
| CN | 101959647 A | 1/2011 |
| DE | 10250823 A1 | 5/2004 |
| JP | 2000288922 A | 10/2000 |
| JP | 2001-191247 A | 7/2001 |
| JP | 2003119098 A | 4/2003 |
| JP | 2004148497 A | 5/2004 |
| JP | 2009012086 A | 1/2009 |
| JP | 2012171035 A | 9/2012 |
| WO | 2009107333 A1 | 9/2009 |

OTHER PUBLICATIONS

Aug. 2, 2016 Office Action issued in Chinese Patent Application No. 201480006747.6.

Aug. 18, 2015 International Preliminary Report on Patentability issued in International Application No. PCT/JP2014/000134.

Apr. 22, 2014 International Search Report issued in International Application No. PCT/JP2014/000134.

Aug. 25, 2015 Office Action issued in Japanese Patent Application No. 2013-250319.

Apr. 12, 2017 Office Action issued in Chinese Patent Application No. 201480006747.6.

* cited by examiner

THIS IS REPRESENTED BY PLUS IF IT PROTRUDES IN RELATION TO BASE MATERIAL

THIS IS REPRESENTED BY MINUS IF IT IS LOWER IN RELATION TO BASE MATERIAL (A)

(B)

METHOD OF PRODUCING CARRIER FOR USE IN DOUBLE-SIDE POLISHING APPARATUS AND METHOD OF DOUBLE-SIDE POLISHING WAFERS

TECHNICAL FIELD

The present invention relates to a method of producing a carrier, for use in a double-side polishing apparatus, that holds a wafer and is disposed between upper and lower turn tables, to which polishing pads are attached, of the double-side polishing apparatus during double-side polishing, and a method of double-side polishing wafers with the carrier for use in a double-side polishing apparatus.

BACKGROUND ART

When both surfaces of wafers are simultaneously polished by a polishing process, the wafers are held with carriers for use in a double-side polishing apparatus. Each carrier is formed so as to have a thickness thinner than that of the wafer and a holding hole to hold the wafer at a prescribed position between a upper turn table and a lower turn table of the double-side polishing apparatus. The wafer is inserted and held in the holding hole. The upper and lower surfaces of the wafer are interposed between polishing means such as polishing pads attached to opposing faces of the upper turn table and the lower turn table and polished while a polishing agent is supplied to polishing surfaces.

Mainstream carriers for use in this type of double-side polishing of wafers are made of metal such as titanium or stainless steel, or glass epoxy. In a metal carrier, an insert made of resin such as engineering plastic to protect the edge of a wafer from being damaged by the carrier is attached along an inner circumferential portion of its holding hole.

In this way, polishing with the carrier having the insert attached between the holding hole and the wafer allows the prevention of the damage to the wafer edge.

As disclosed in, e.g., Patent Document 1, a production method of fixing the insert to the carrier by means of engaging, sticking, injection molding, or other means is given as this type of method of producing a carrier for use in a double-side polishing apparatus.

Patent Document 2 discloses that after an insert is engaged, the thickness of the insert and the carrier is equalized by a polishing process so as to make their height equal.

There is also a producing method that involves engaging a groove formed on the inner circumference of a holding hole of a carrier body with a protrusion formed on the outer circumference of an insert (See Patent Document 3). This method makes an attempt to inhibit the insert from slipping out of position and falling off to prevent the wear of the insert and a sag on an outer circumference portion of a workpiece due to the wear during workpiece polishing processes.

CITATION LIST

Patent Literature

Patent Document 1: Japanese Unexamined Patent publication (Kokai) No. 2004-148497
Patent Document 2: Japanese Unexamined Patent publication (Kokai) No. 2012-171035
Patent Document 3: Japanese Unexamined Patent publication (Kokai) No. 2009-12086

SUMMARY OF INVENTION

Technical Problem

A double-side polishing apparatus usually polishes wafers, e.g., about five wafers at the same time per one batch process. The carriers, for use in a double-side polishing apparatus, which have a holding hole as above and are equal in number to the wafers are set. The same number of the wafers as the carriers are simultaneously double-side polished.

It was however revealed that the wafers that have been simultaneously polished in this way have variation in flatness.

The present invention was accomplished in view of the above-described problems. It is an object of the present invention to provide a method of producing a carrier for use in a double-side polishing apparatus and a method of double-side polishing wafers that can inhibit the variation in flatness of the wafers polished in a batch process.

Solution to Problem

To achieve this object, the present invention provides a method of producing a carrier for use in a double-side polishing apparatus, the method including engaging an insert with a holding hole formed in a carrier body and sticking the insert to the holding hole, the carrier body being configured to be disposed between upper and lower turn tables to which polishing pads are attached of the double-side polishing apparatus, the holding hole being configured to hold a wafer during polishing, the insert being configured to contact an edge of the wafer to be held, the method comprising: performing a lapping process and a polishing process on the insert; engaging the insert subjected to the lapping process and the polishing process with the holding hole of the carrier body; and sticking and drying the engaged insert while applying a load to the insert in a direction perpendicular to main surfaces of the carrier body.

This inventive method of producing a carrier for use in a double-side polishing apparatus can increase the uniformity of the carrier to be produced. More specifically, in production of the carriers, variation in insert thickness among the carriers can be inhibited by the lapping and polishing processes. In addition, in production of the carriers, misalignment between the carrier body and the insert among the carriers can be inhibited by the step of sticking and drying while applying the load. The geometry variation among the carriers can thereby be inhibited.

The uniformity of the carrier is important to inhibit the variation in flatness of wafers polished in a batch process. Since the carrier produced by the present invention has high uniformity as above, when such carriers are used to simultaneously double-side polish plural wafers, the variation in flatness of the wafers polished in the same batch process can be inhibited. In other words, polished wafers having uniform quality can be provided.

At this time, an insert having a thickness at least 20 μm thicker than a target thickness after the lapping process and the polishing process may be prepared as the insert to be subjected to the lapping process and the polishing process.

In this way, the variation in insert thickness, which is resulted from a portion thinner than the target thickness being present before processing due to variation in thickness that the insert has in its plane from the beginning, can be prevented from remaining after the insert is processed so as to have the target thickness.

Moreover, the load applied to the insert may range from 100 to 300 g/cm².

In this way, sticking with the misalignment due to an insufficient pushing force can be more effectively prevented by a load of 100 g/cm² or more. In addition, the occurrence of the misalignment that is caused by excessively pushing the insert can be further prevented by a load of 300 g/cm² or less.

Moreover, when the engaged insert is stuck and dried while the load is applied to the insert, the carrier body with which the insert is engaged may be placed on a horizontal base, a weight may be placed on the insert, and the horizontal base and the weight to be used may have a load surface with a flatness of 3 μm or less.

In this way, the variation in flatness of the load surface of the horizontal base and the weight can be inhibited, and the amount of pushing the insert can be effectively prevented from being uneven in the circumferential direction. The occurrence of the misalignment of the insert can thereby be further inhibited.

Moreover, the present invention provides a method of double-side polishing wafers, comprising: preparing a plurality of carriers, for use in a double-side polishing apparatus, produced by the above method of producing a carrier for use in a double-side polishing apparatus; holding each of the wafers in the holding hole; disposing the carriers between upper and lower turn tables of the double-side polishing apparatus; and simultaneously double-side polishing the wafers.

This inventive method of double-side polishing wafers can inhibit the variation in flatness of the wafers polished in the same batch process, and thereby provide polished wafers having uniform quality.

Advantageous Effects of Invention

As described above, the present invention can provide a carrier with high uniformity, for use in a double-side polishing apparatus. This carrier allows the inhibition of the variation in flatness of wafers polished in a batch process in double-side polishing.

DESCRIPTION OF EMBODIMENTS

An embodiment of the present invention will be hereinafter described in detail with reference to the figures, but the present invention is not limited to this embodiment.

The present inventors diligently conducted researches concerning the occurrence of the variation in flatness of wafers polished in the same batch process in double-side polishing.

The uniformity of carriers is important to make the flatness of wafers polished in a batch process uniform. The present inventors found that the geometry of the carriers in the batch process is not necessarily uniform due to the variation in insert thickness and the misalignment between the carrier body and the insert among the carriers, and therein lies a problem.

The present inventors accordingly found that a carrier having high uniformity can be provided by previously performing a lapping process and a polishing process on the insert and sticking the insert to a carrier body and drying the insert while a load is applied to the insert when the insert is engaged with a holding hole of the carrier, and this carrier allows reduction in quality variation of wafers polished in the same batch process. The present inventors thereby brought the present invention to completion.

Figure 1:
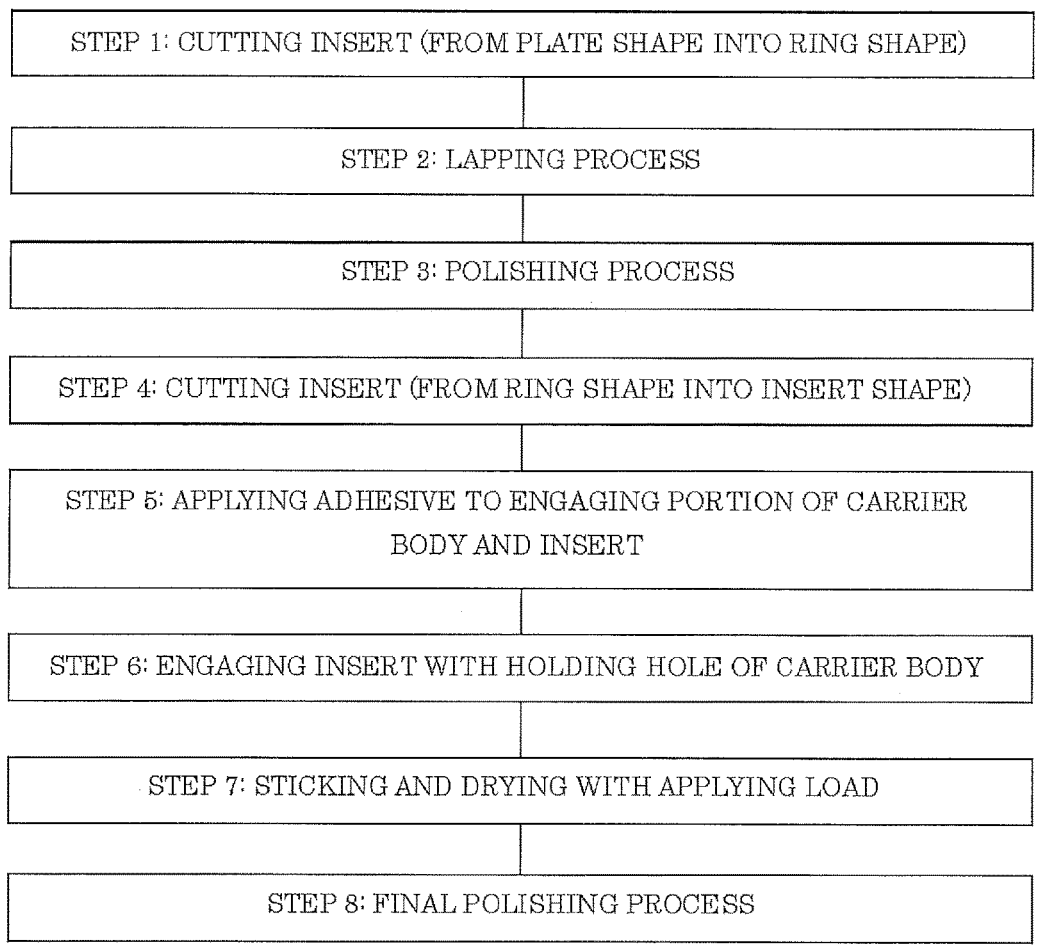
FIG. 1 is a flowchart of an example of the inventive method of producing a carrier for use in a double-side polishing apparatus.

FIG. 1 is a flowchart of an example of the inventive method of producing a carrier for use in a double-side polishing apparatus.

It suffices that at least a step of performing the lapping process and the polishing process on the insert and a step of engaging the insert subjected to these processes with a holding hole of a carrier body and sticking and drying the insert while applying a load to the insert in a direction perpendicular to main surfaces of the carrier body are included. Other than these steps, as shown in FIG. 1, various steps may be appropriately added.

(Step 1: Cutting an Insert (From a Plate Shape Into a Ring Shape))

First, an insert made of engineering plastic such as EG or AFRP is prepared and cut into a shape proper for the lapping process and the polishing process. For example, it is possible to cut a plate insert into a ring shape larger than a shape (insert shape) when being finally engaged with the holding hole of the carrier body. In consideration of stock removals in the successive lapping and polishing processes and other processes, it is possible to cut into a slightly larger one as described above. Naturally, without limiting to the ring shape, the cut shape may be appropriately decided so that the above processes can be properly performed.

Note that cutting such that the thickness is at least 20 μm thicker than the target thickness after the lapping process and the polishing process is better. For example, it is possible to prepare a plate insert having a thickness at least 20 μm thicker than the target thickness and cut this insert. Preparing a cut insert having such a thickness can secure a stock removal enough to remove variation in thickness that is present from the beginning by the lapping process, or other processes. This can more reliably prevent the variation in thickness from remaining after the lapping process, or other processes, and thereby produce a carrier having high uniformity.

(Step 2: Lapping Process)

Next, the lapping process is performed on the cut ring insert. The conditions of the lapping process are not particularly limited and may be determined properly.

For example, it is possible to prepare a carrier for a ring that is proper to perform the lapping process on the ring insert, to interpose the ring insert and the carrier for a ring between upper and lower turn tables that are made of cast iron and have grooves, and to perform the process with a lapping slurry such as a GP2000 slurry.

(Step 3: Polishing Process)

Next, the polishing process is performed on the ring insert after the lapping process. The conditions of the polishing process are not particularly limited and may be determined properly.

For example, it is possible to interpose the ring insert and the carrier for a ring between upper and lower turn tables to which hard foamed polyurethane pads are attached, and to perform the process with a polishing slurry such as a cerium oxide slurry.

(Step 4: Cutting the Insert (From the Ring Shape to the Insert Shape))

The ring insert is cut into a shape (insert shape) that can be engaged with the holding hole of the carrier body and contact the edge of a wafer to be held in double-side polishing.

The variation in insert thickness among the carriers is one of the causes of the variation in flatness of wafers polished in a batch process, as above. The insert in the inventive producing method can improve in-plane variation in insert thickness, for example, below 2 μm because the above steps 2 and 3 have been performed, and thereby be uniform among the carriers.

Figure 13:
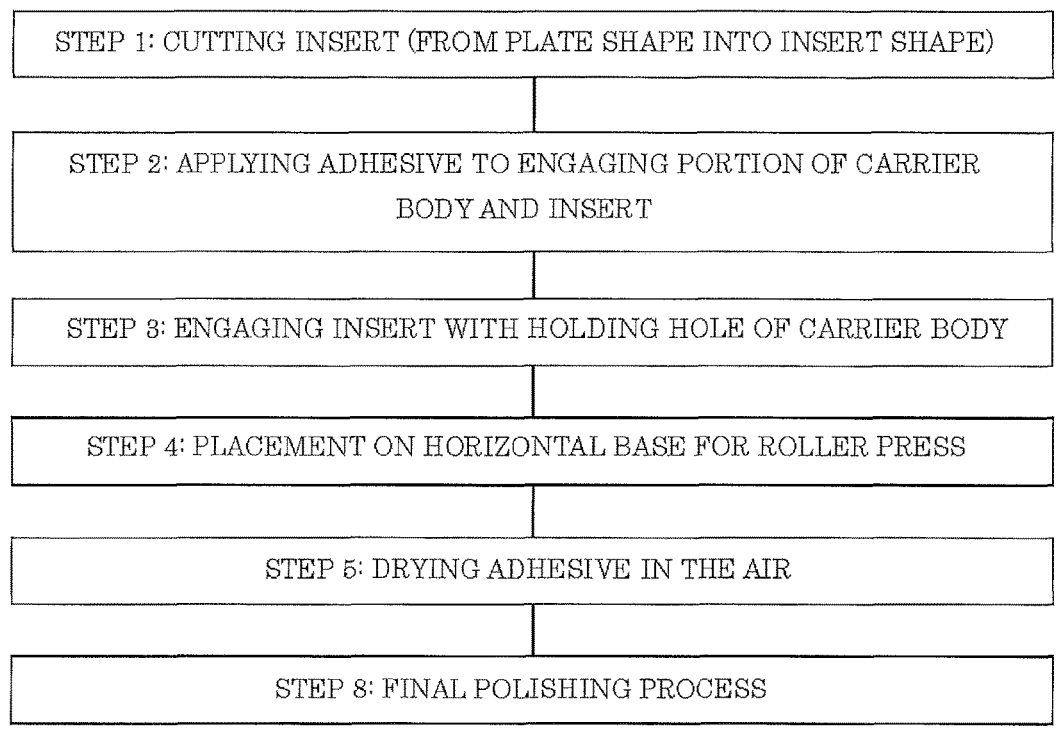
FIG. 13 is a flowchart of an example of a conventional method of producing a carrier for use in a double-side polishing apparatus.

Compared with these steps of producing the insert according to the invention, a conventional method shown in FIG. 13 involves merely cutting a plate insert into an insert shape. Thus, there exists the in-plane variation in thickness that resin etc., forming the insert has from the beginning, and the variation in insert thickness occurs among the carriers. Such variation has a serious adverse effect on the variation in flatness of polished wafers.

Unlike such a conventional method, the variation in insert thickness among the carriers can be significantly improved by performing the lapping process and other processes like the invention.

(Step 5: Applying an Adhesive to an Engaging Portion of the Carrier Body and the Insert)

An adhesive is applied to an engaging portion such as an inner circumferential portion of the holding hole of the carrier body, and the outer circumference of the insert (insert shape). The type of the adhesive is not particularly limited; a proper adhesive such as an epoxy adhesive may be used.

Note that the carrier body may be made of metal such as titanium or stainless steel, or glass epoxy.

(Step 6: Engaging the Insert with the Holding Hole of the Carrier Body)

The insert (insert shape) is engaged with the holding hole of the carrier body. The engaging method is not particularly limited, provided the method enables proper engagement.

(Step 7: Sticking and Dying with Applying a Load)

Figure 2:
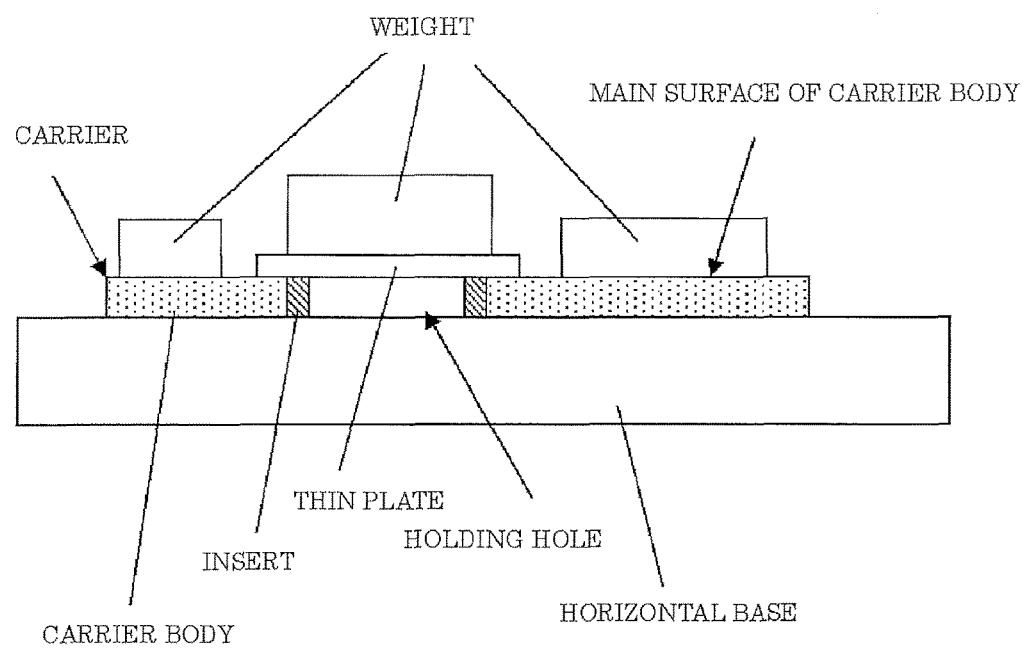
FIG. 2 is an explanatory view of an exemplary method of sticking and drying in the present invention.

Next, the engaging portion is stuck and dried. An exemplary method of this sticking and drying is shown in FIG. 2. As shown in FIG. 2, the carrier body in which the insert is engaged with the holding hole is laid on a horizontal base, and a load is applied to the insert in the holding hole in the direction perpendicular to main surfaces of the carrier body by placing a weight above the insert, laying a thin plate therebetween. At this time, other weights may be placed on the carrier body. The insert is stuck to the carrier body while the load is applied in this way. The adhesive is then dried and solidified (a sticking method with a load).

The sticking and drying in this way allows the misalignment between the carrier body and the insert to be inhibited from occurring during this process. The misalignment, which is the other cause of the variation in flatness of wafers polished in a batch process, can be improved.

For example, an average angle of the insert to the carrier body may be an absolute value of 0.06° or less. This can improve the degree of parallelization of the insert to the carrier body and thereby increase the uniformity of the average angle among the carriers.

Moreover, the load applied to the insert at this time preferably ranges from 100 to 300 g/cm$^2$. Sticking with the misalignment due to an insufficient pushing force can be more effectively prevented by a load of 100 g/cm$^2$ or more. In addition, the occurrence of the misalignment that is caused by excessively pushing the insert can be further prevented by a load of 300 g/cm$^2$ or less.

However, the load is naturally not limited to these values, and can be determined each time.

Moreover, at this time, the horizontal base and the weights preferably have a load surface (i.e., a surface of the horizontal base on which the carrier body is placed, or a contact surface of the weights with the insert or the carrier body) with a flatness of 3 μm or less. Note that if the thin plate is laid as shown in FIG. 2, since this thin plate serves as a weight to apply its load to the carrier body and the insert, it is preferable to use a thin plate having a surface with a flatness of 3 μm or less that is to contact the carrier body and the insert.

When this flatness is 3 μm or less, the amount of pushing the insert can be more effectively prevented from being uneven in the circumferential direction of the insert, the misalignment of the insert can be prevented, and the insert can be further prevented from unevenly wearing during a workpiece polishing process.

Note that the flatness is not limited to 3 μm or less, and may be determined depending on the required precision.

Moreover, the method of measuring the flatness is not particularly limited, and may be determined appropriately. For example, the flatness can be obtained by measuring the thickness of the horizontal base and the weight in the plate shape at six points on the load surface. This number of the measuring points is not limited to six, and may be increased or decreased depending on time and effort, or the required precision.

Note that it is naturally not limited to this method of measuring the flatness, and may be determined each time.

Compared with this inventive method of sticking and drying the insert and the carrier body, the conventional method shown in FIG. 13 is to apply an adhesive to the engaging portion, press an insert on a horizontal base by roller pressing, and then dry and stick the adhesive in the air with a carrier turned to the vertical direction. At this time, the insert may be engaged and stuck under conditions where the insert is not parallel nor horizontal on the carrier lower surface and misalignment occurs such that the insert protrudes diagonally upward in relation to a carrier body. In this time, the absolute value of the average angle of the insert to the carrier body is large. The portion that protrudes diagonally upward thereby wears unevenly during workpiece processing. This also causes the variation in insert thickness.

Unlike such a conventional method, the degree of parallelization of the insert to the carrier body can be improved by the sticking and drying according to the present invention, as above.

(Step 8: Final Polishing Process)

After the sticking and drying are performed while the load is applied in the above manner, a final polishing process is performed to achieve the target finishing thickness. For example, the same final polishing process as conventionally can be performed.

The inventive method of producing a carrier for use in a double-side polishing apparatus can inhibit the variation in insert thickness and the misalignment between the carrier body and the insert among the carriers, which are caused by the conventional method. In other words, the carrier can be produced with high uniformity.

Moreover, a method of double-side polishing wafers according to the preset invention involves preparing a plurality of carriers produced in the above manner, and disposing the carriers between upper and lower turn tables, to which polishing pads are attached, of a double-side polishing apparatus with each of the wafers held in the corresponding holding hole. The apparatus is then driven while a slurry is supplied and the wafers are double-side polished at the same time.

Such a double-side polishing method uses the carriers having high uniformity and can thereby inhibit the variation in flatness of the wafers polished in the same batch process. The quality of the polished wafers can be remarkably made uniform as compared with the conventional double-side polishing method using non-uniform carriers.

EXAMPLE

The present invention will be more specifically described below with reference to an example and a comparative example, but the present invention is not limited to these.

Example

According to the inventive method of producing a carrier for use in a double-side polishing apparatus as shown in FIG. 1, carriers were produced. Wafers were double-side polished with these carriers.

The target finishing thickness (the step 8 in FIG. 1) was set at 765 μm. The insert used was made of EG. After a plate insert having a thickness of 1000 μm was cut into a ring shape, a lapping process and a polishing process were performed under the following conditions. The insert shape was then cut out.

Table 1 shows the lapping conditions and the polishing conditions.

TABLE 1

|  | LAPPING PROCESS | POLISHING PROCESS |
|---|---|---|
| APPARATUS | USP-22B | USP-15B (IMPROVED 20B) |
| SLURRY | GC#2000 | MILRK(ES3-6) |
| POLISHING PAD | CASTING TURN TABLE | MH-C15G |
| CARRIER | SK MATERIAL (SIZE OF 20B) | SK MATERIAL (SIZE OF 20B) |
| LOAD | 0.12 kg/cm$^2$ | 0.08 kg/cm$^2$ |
| ROTATIONAL SPEED OF LOWER TURN TABLE | 5 rpm | 15 rpm |
| RATE | 0.6 μm/min | 0.25 μm/min |

Next, a carrier body (a base material) made of titanium was prepared. An adhesive (a two part curable epoxy resin adhesive) was applied to the insert cut into the insert shape and the holding hole of the carrier body. The insert was engaged with the holding hole. As shown in FIG. 2, the carrier body was then laid on a horizontal base. The insert and the holding hole were stuck and dried by placing weights on a main surface of the carrier body and the insert. The load applied to the insert by the weight was 200 g/cm$^2$. The used horizontal base on which the carrier base was placed, the used weight for metal (the weight placed on the main surface of the carrier body), the used weight for resin (the weight placed on the insert), and the used thin plate all had a load surface with a flatness of 3 μm, which was obtained by measuring their thickness at six points.

Then, the final polishing was performed, so that the carrier for use in a double-side polishing apparatus was produced.

Next, a double-side polishing process of semiconductor silicon wafers having a diameter of 300 mm was performed with the produced carriers. DSP-20B made by Fujikoshi Machinery Corp., MH-S15A made by Nitta Haas Incorporated as polishing pads, GLANZOX2100 made by FUJIMI INCORPORATED as a polishing slurry were used. Five of the carriers holding wafers in the respective holding holes were set. The five wafers were double-side polished in a single batch process.

Comparative Example

According to the conventional method of producing a carrier for use in a double-side polishing apparatus as shown in FIG. 13, carriers were produced. Wafers were double-side polished with these carriers.

The same plate insert as in the example was prepared and cut into the insert shape directly without performing the lapping and polishing processes, unlike the example.

Next, the same carrier body as in the example was prepared. An adhesive was applied to the insert cut into the insert shape and the holding hole of the carrier body. The insert was engaged with the holding hole. Unlike the example, after roller pressing on a horizontal base, the adhesive was dried in the air.

Then, the final polishing was performed, so that the carrier for use in a double-side polishing apparatus was produced.

Next, a double-side polishing process of semiconductor silicon wafers having a diameter of 300 mm was performed with the produced carriers in the same manner as in the example.

The measurement result of the quality etc., of the insert, the carrier, and the polished wafers in the example and the comparative example will now be described.

First, thickness data of the insert will be described.

Table 2 shows the thickness data of the ring inserts after the lapping and polishing processes in the example. The thickness was measured by using a micrometer made by Mitutoyo Corporation. Four points (at 90° intervals) were measured.

As shown in Table 2, in all cases, the in-plane variation in thickness was improved up to 1 to 2 μm per insert by performing the lapping and polishing processes. The quality among the inserts (thickness variation) can be made uniform.

Regarding the thickness data of the inserts in the comparative example, on the other hand, the thickness data of the insert cut from the plate insert into the ring shape was measured to be compared with the example. Table 3 shows the measurement result.

Note that although the insert used to produce the carrier had a thickness of about 765 μm, Table 3 shows the result of one having a thickness of 1000 μm. The values shown in Table 3 are identical to the values before the lapping and polishing processes in the example. Moreover, one having a thickness of about 765 μm used in the comparative example exhibited substantially the same in-plane variation in thickness as in Table 3.

As shown in Table 3, the in-plane variation in thickness of some inserts in the comparative example was as large as 42 μm at its maximum. In addition, it can be seen that the variation was 2 μm at its minimum. It was thus confirmed that the quality of the inserts was non-uniform.

Figure 3:
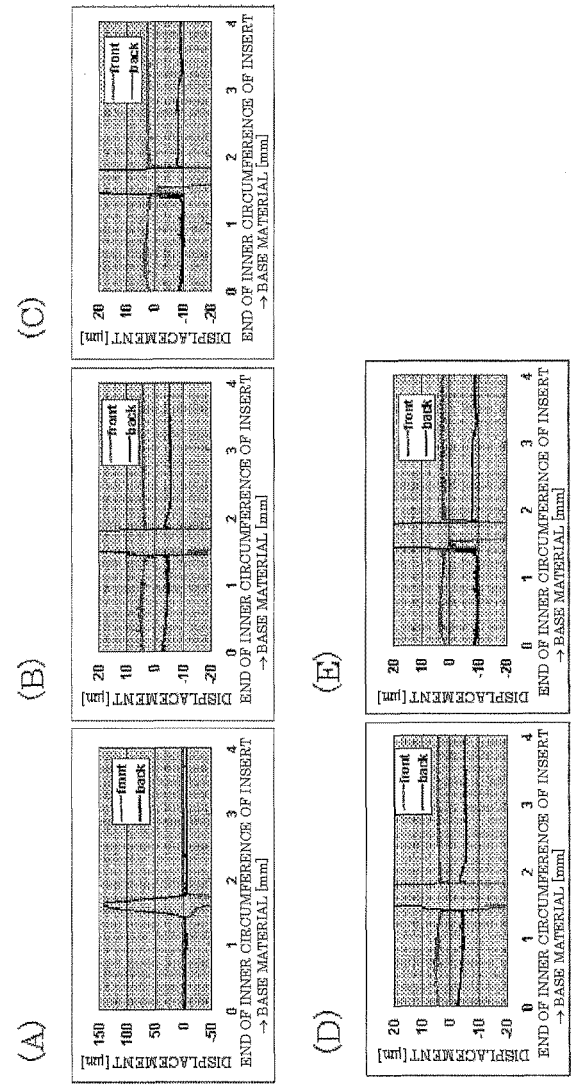
FIG. 3 are graphs of the degree of parallelization of carrier bodies and inserts in Example.

As shown in FIG. 3, it can be seen that all of them in the lot were engaged and stuck substantially parallel and horizontally. It can be also seen that the inserts were not engaged diagonally, and steps between the inserts and the carrier bodies were strongly inhibited.

Figure 10:
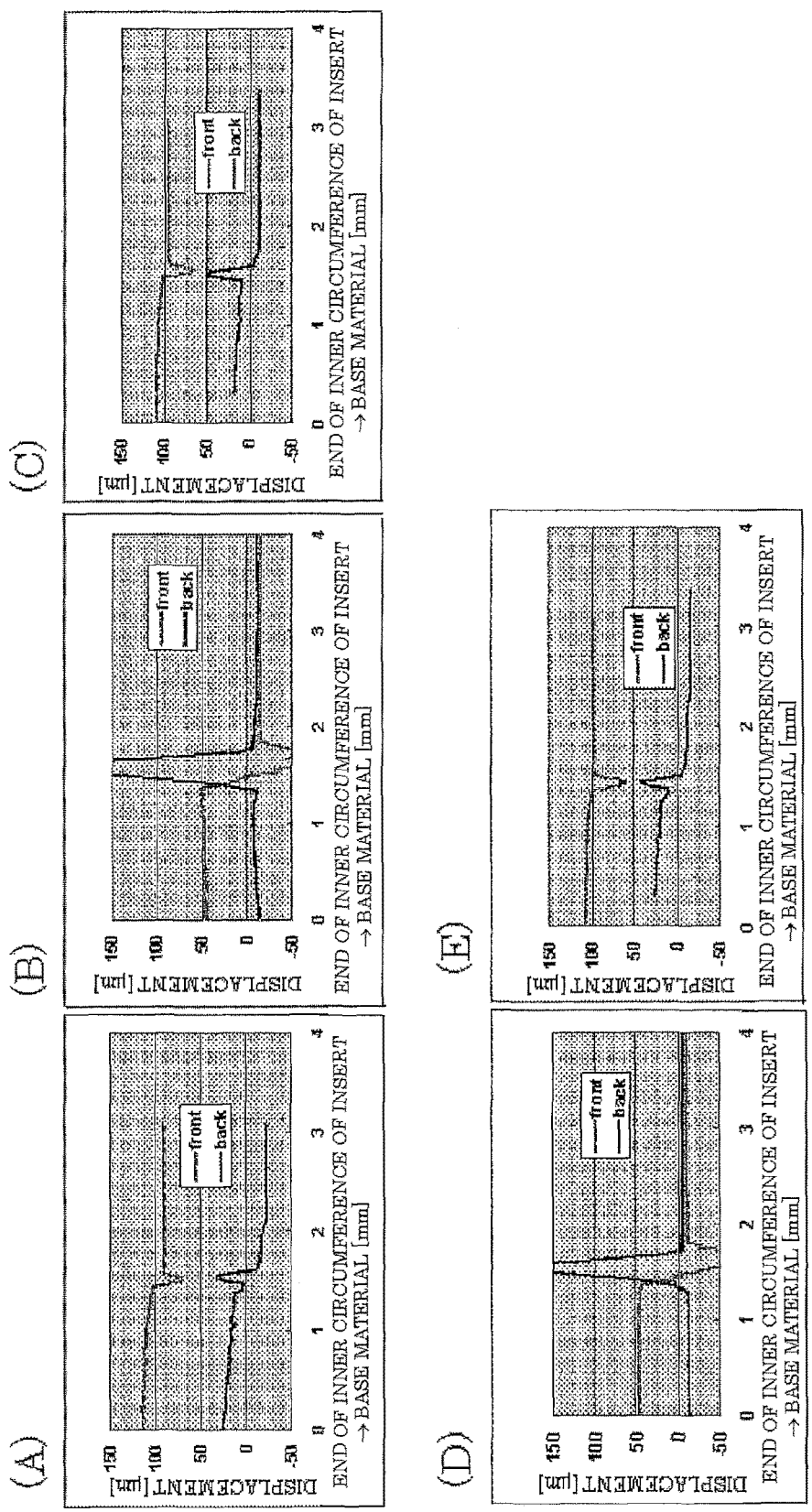
FIG. 10 are graphs of the degree of parallelization of carrier bodies and inserts in Comparative Example.

The measurement result of the comparative example, on the other hand, is shown in FIG. 10. As shown in FIG. 10, it can be seen that the inserts were engaged diagonally, large steps were produced, and there were variations in the lot.

In addition, the angle of the insert to the carrier body will be described.

For the measurement, LJ-V7060K made by KEYENCE CORPORATION was used. The measuring points were four for each carrier, and an average value in each carrier was obtained from the four points. In addition, an average value measured in the five carriers in the lot was obtained. Table 4 shows the results in the cases of the example and the comparative example.

Figure 5:
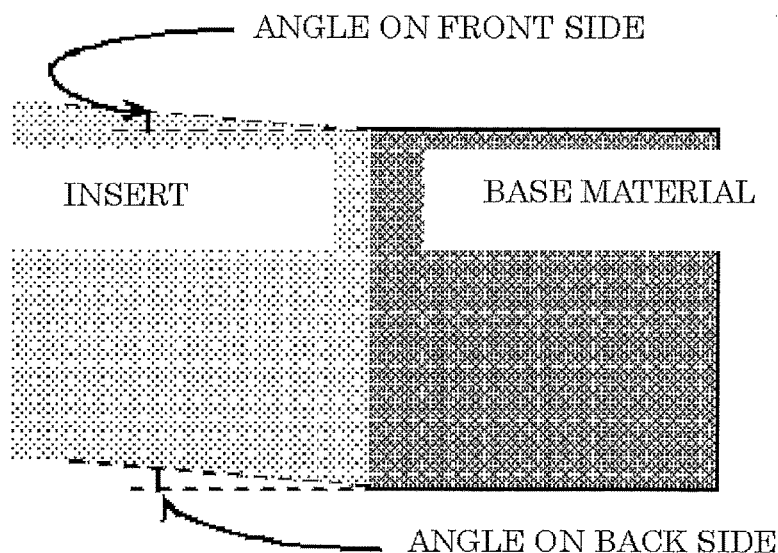
FIG. 5 is an explanatory view of the meaning of symbols of measured angles of an insert with respect to a carrier body.

Note that FIG. 5 shows the content that the symbols of the angles measured by LJ-V7060K mean.

As shown in Table 4, when the absolute value of the average angle of the insert to the carrier body is taken as an indicator, it can be seen that the example achieved a small value of 0.06° and a great improvement compared with the comparative example (0.23°).

TABLE 2

[μm]
| MEASUREMENT POSITION | SAMPLE1 | SAMPLE2 | SAMPLE3 | SAMPLE4 | SAMPLE5 | SAMPLE6 | SAMPLE7 | SAMPLE8 | SAMPLE9 | SAMPLE10 |
|---|---|---|---|---|---|---|---|---|---|---|
| 1 | 779 | 778 | 779 | 778 | 777 | 779 | 780 | 780 | 780 | 780 |
| 2 | 777 | 779 | 778 | 778 | 777 | 779 | 779 | 780 | 780 | 780 |
| 3 | 778 | 777 | 780 | 777 | 777 | 780 | 780 | 780 | 779 | 778 |
| 4 | 779 | 778 | 779 | 777 | 779 | 780 | 780 | 779 | 780 | 780 |
| avg. | 778.25 | 778 | 779 | 777.5 | 777.5 | 779.6 | 779.3 | 779.3 | 778.9 | 779.1 |
| max | 779 | 779 | 780 | 778 | 779 | 780 | 780 | 780 | 780 | 780 |
| min | 777 | 777 | 778 | 777 | 777 | 779 | 779 | 779 | 779 | 778 |
| range | 2 | 2 | 2 | 1 | 2 | 1 | 1 | 1 | 1 | 2 |

TABLE 3

[μm]
| MEASUREMENT POSITION | SAMPLE1 | SAMPLE2 | SAMPLE3 | SAMPLE4 | SAMPLE5 | SAMPLE6 | SAMPLE7 | SAMPLE8 | SAMPLE9 | SAMPLE10 |
|---|---|---|---|---|---|---|---|---|---|---|
| 1 | 1033 | 1012 | 1026 | 1034 | 1039 | 1024 | 1010 | 1007 | 1028 | 1026 |
| 2 | 1042 | 1020 | 1007 | 1020 | 1038 | 1019 | 1034 | 1036 | 1038 | 1020 |
| 3 | 1026 | 1032 | 1021 | 1013 | 1038 | 997 | 1040 | 1033 | 1025 | 1006 |
| 4 | 1017 | 1037 | 1039 | 1029 | 1037 | 1025 | 1035 | 1006 | 996 | 984 |
| avg. | 1030 | 1025 | 1023 | 1024 | 1038 | 1016 | 1030 | 1021 | 1022 | 1009 |
| max | 1042 | 1037 | 1039 | 1034 | 1039 | 1025 | 1040 | 1036 | 1038 | 1026 |
| min | 1017 | 1012 | 1007 | 1013 | 1037 | 997 | 1010 | 1006 | 996 | 984 |
| range | 25 | 25 | 32 | 21 | 2 | 28 | 30 | 30 | 42 | 42 |

Next, the degree of parallelization of the carrier body and the insert of the completed carriers will be described.

For the measurement of the degree of parallelization, a contact profiler (FormTarysurfIntra made by Taylor Hobson Ltd.) was used.

The result of measuring one point for each of five carriers in one lot is shown in FIGS. 3(A) to 3(E) as the measurement result of the example.

Figure 4:
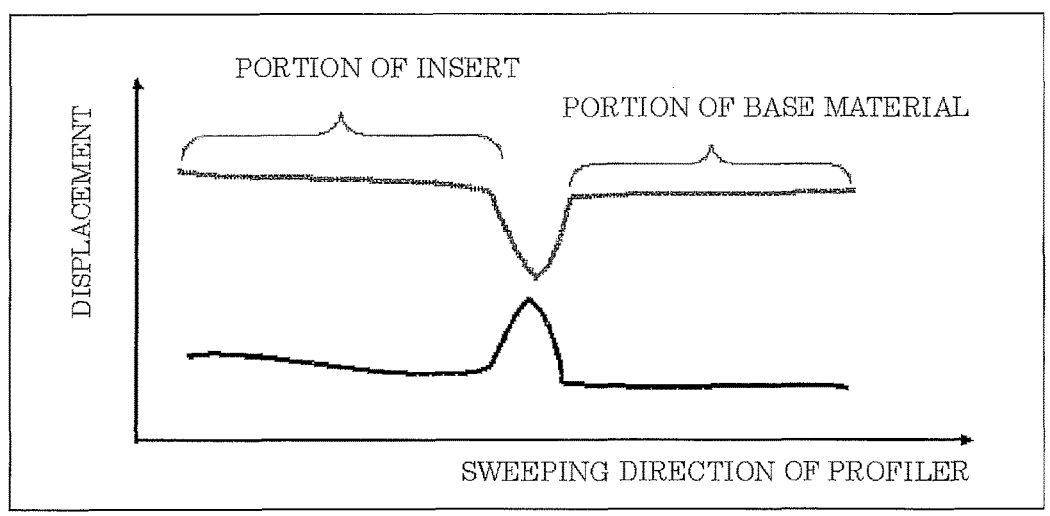
FIG. 4 is an explanatory view of an example of how to see a graph of degree of parallelization.

Note that how to see the result measured by FormTarysurfIntra is shown in FIG. 4.

TABLE 4

[deg.]
| | FRONT SIDE | | BACK SIDE | |
|---|---|---|---|---|
| | ave. | σ | ave. | σ |
| COMPARATIVE EXAMPLE | 0.22 | 0.41 | −0.23 | 0.24 |
| EXAMPLE | 0.01 | 0.3 | −0.06 | 0.24 |

Figure 6:
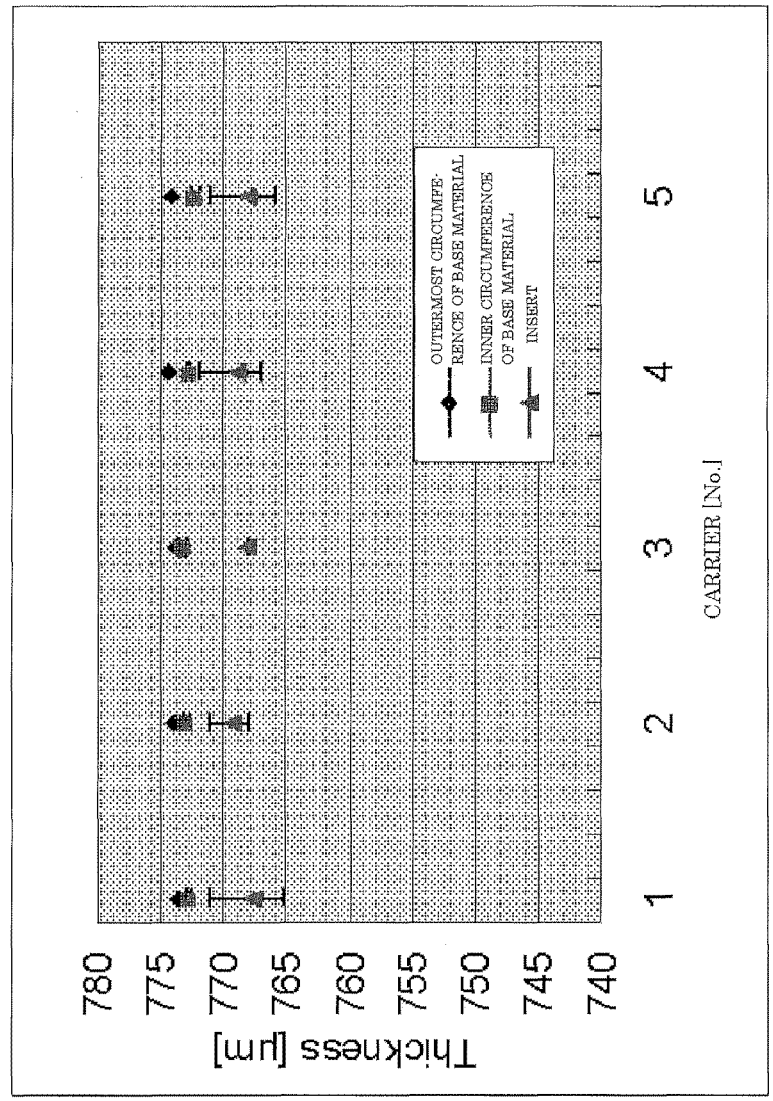
FIG. 6 is a graph of the thickness of the insert, the outermost circumference of the carrier body, and the inner circumference of the carrier body of a carrier in Example.
Figure 11:
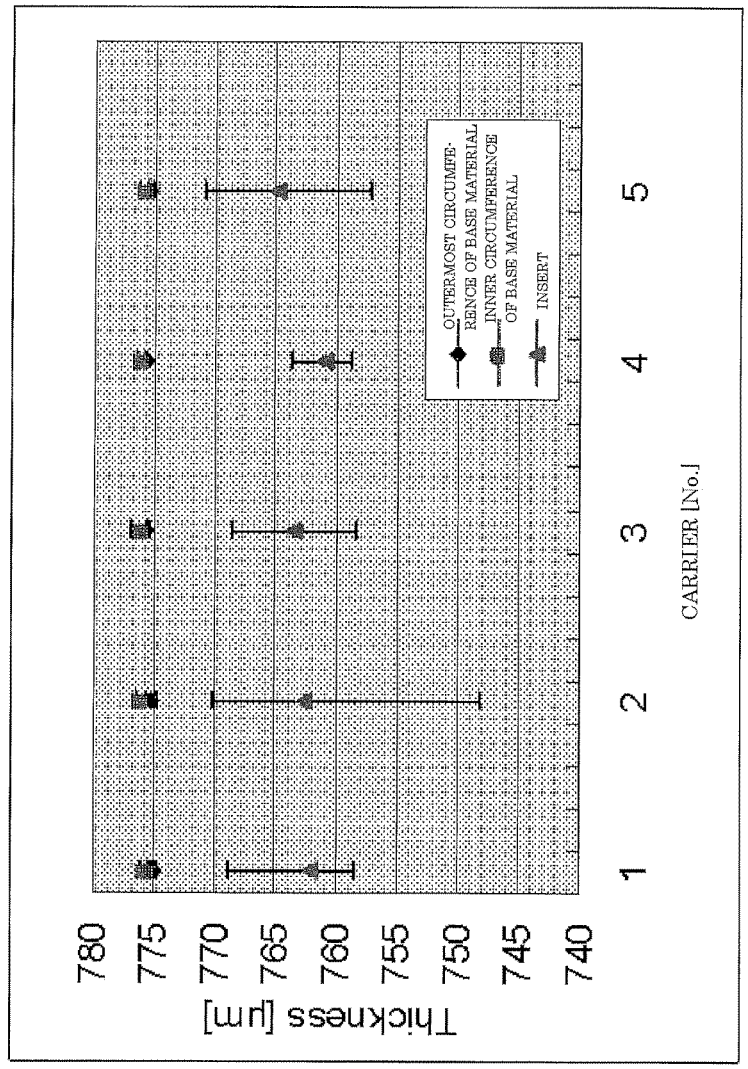
FIG. 11 is a graph of the thickness of the insert, the outermost circumference of the carrier body, and the inner circumference of the carrier body of a carrier in Comparative Example.

In addition, the thickness (the maximum value and the minimum value of each item) of the insert, the outermost circumference of the carrier body, the inner circumference of the carrier body of the produced carriers (five in one lot) was measured. FIG. 6 shows the measurement result in the case of the example. FIG. 11 shows the measurement result in the case of the comparative example.

As shown in FIG. 6, in the example, the variation in insert thickness was inhibited in all cases, and the quality was generally uniform.

As shown in FIG. 11, in the comparative example on the other hand, the variation in thickness of each insert was comparatively large, and the magnitude of the variation greatly varied among the carriers and had its variation.

In addition, the flatness and the cross section of the outer circumference of the polished wafers were measured by M49mode and 1 mmEE of Wafersight.

Figure 7:
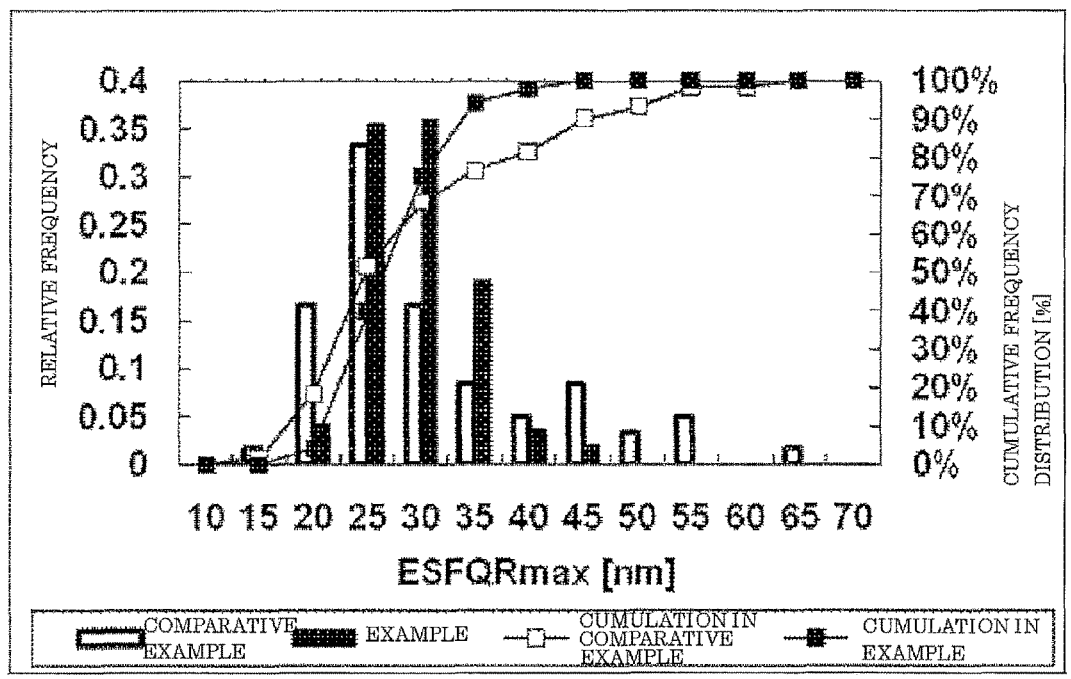
FIG. 7 is a graph of the measurement result of ESFQR of polished wafers in Example and Comparative Example.

FIG. 7 shows the measurement result of ESFQRmax of all the polished wafers in the example and the comparative example.

Figure 8:
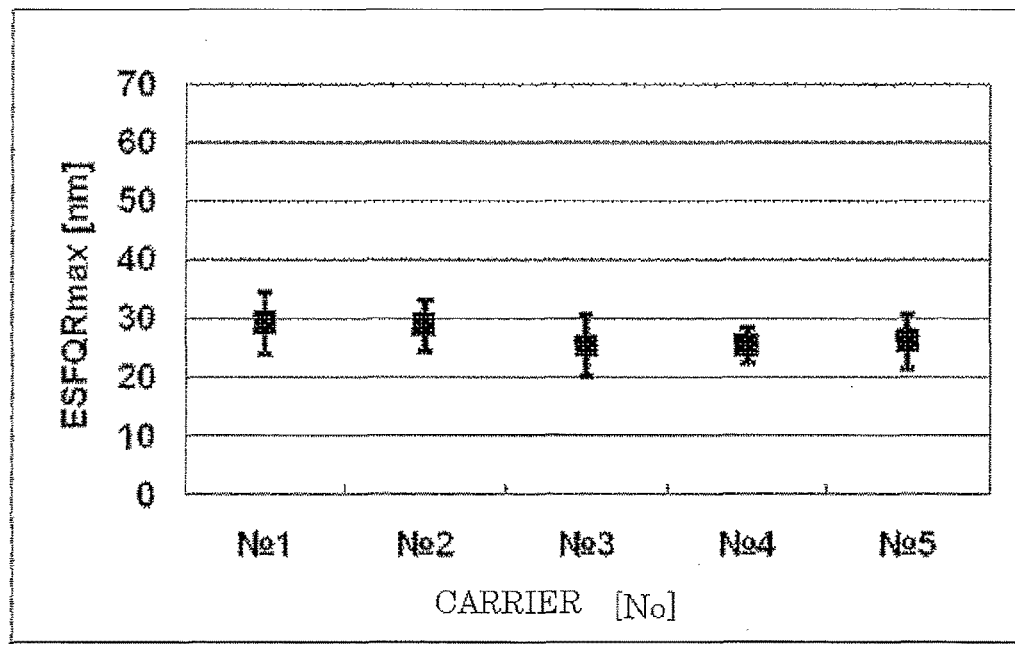
FIG. 8 are graphs of the measurement result of ESFQR$_{max}$ of polished wafers that is separated in every carrier: (A) Example, and (B) Comparative Example.
Figure 8:
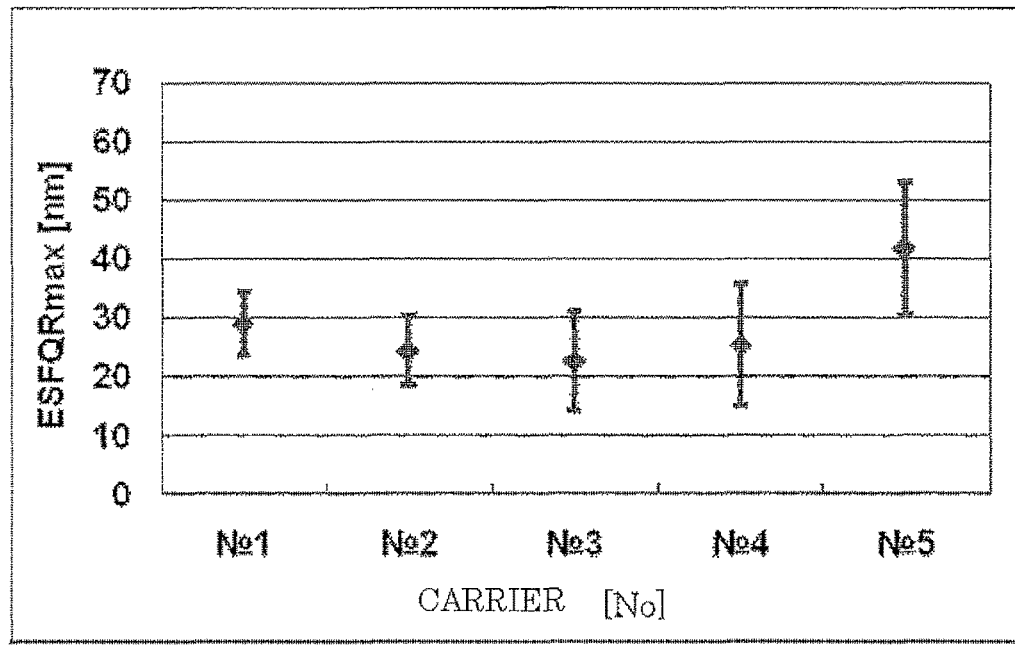

Moreover, the measurement result of $ESFQR_{max}$ of the polished wafers that is separated in every carrier in the example and the comparative example are shown in FIG. 8 ((A) Example; (B) Comparative Example).

Figure 9:
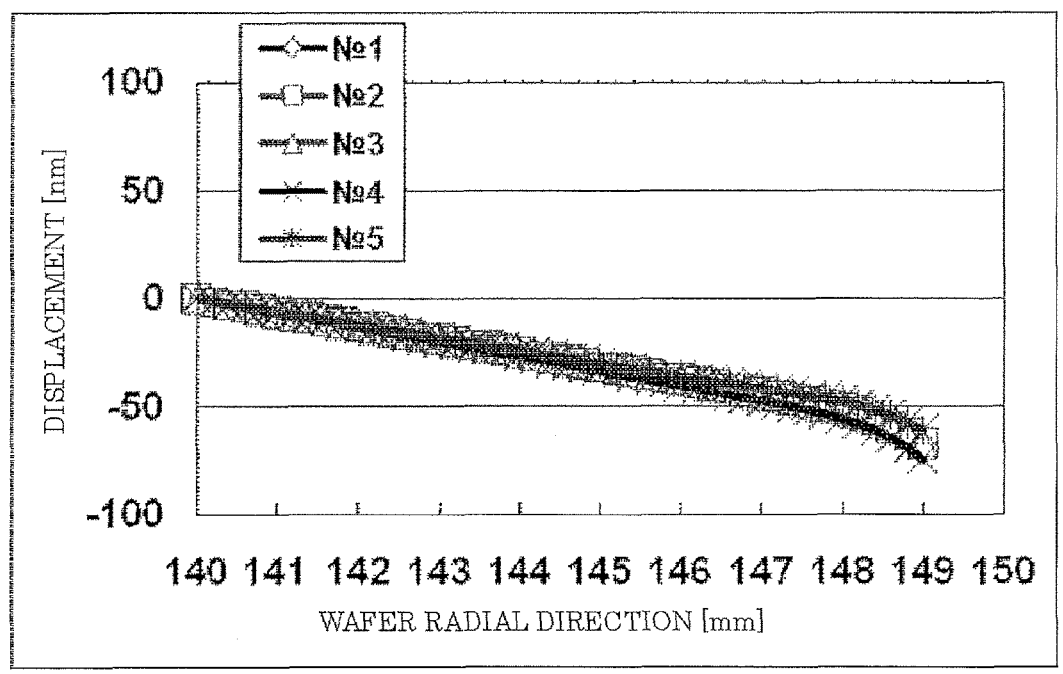
FIG. 9 is a graph of the measurement result of the cross section of the outer circumference of wafers polished in a batch process in Example.
Figure 12:
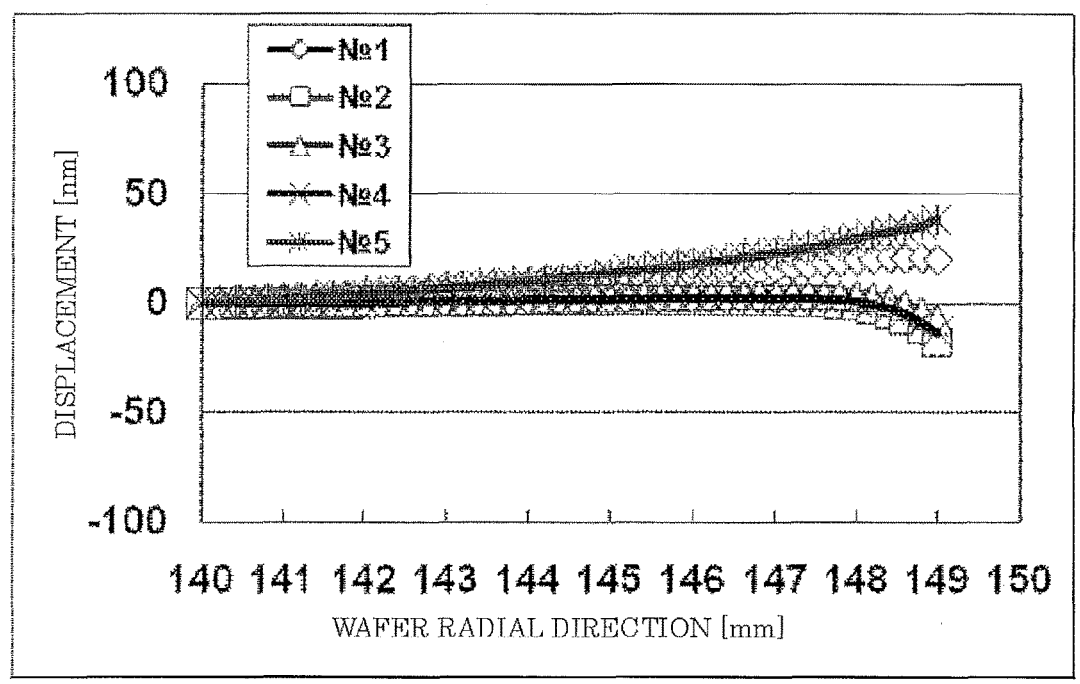
FIG. 12 is a graph of the measurement result of the cross section of the outer circumference of wafers polished in a batch process in Comparative Example.

Moreover, the measurement result of the cross section (four points) of the outer circumference of each polished wafer in the batch process are shown in FIG. 9 (Example) and FIG. 12 (Comparative Example).

As shown in FIG. 8, it can be seen that in the example, the variation in $ESFQR_{max}$ of the polished wafers due to the variation among the used carriers was smaller and made more uniform compared with the comparative example. This uniformization is reflected in a histogram shown in FIG. 7. The variation σ in $ESFQR_{max}$ was 4.89 nm, which was a small value.

As shown in FIG. 7, in the comparative example on the other hand, the variation σ in $ESFQR_{max}$ was 11.06 nm, which was a large value.

Moreover, as shown in FIG. 9, in the example, outer circumferential portions were in the uniform shapes (all of which were sag shapes here) in the batch process.

As shown in FIG. 12, in the comparative example on the other hand, one having an outer circumferential portion formed in the rise shape and one in the sag shape were mixed together, and these shapes were made non-uniform in the batch process.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method of producing a carrier for use in a double-side polishing apparatus, the method including engaging an insert with a holding hole formed in a carrier body and sticking the insert to the holding hole, the carrier body being configured to be disposed between upper and lower turn tables to which polishing pads are attached of the double-side polishing apparatus, the holding hole being configured to hold a wafer during polishing, the insert being configured to contact an edge of the wafer to be held, the method comprising:
    performing a lapping process and a polishing process on the insert;
    engaging the insert subjected to the lapping process and the polishing process with the holding hole of the carrier body; and
    sticking and drying the engaged insert while applying a load to the insert in a direction perpendicular to main surfaces of the carrier body.

2. The method according to claim 1, wherein the insert to be subjected to the lapping process and the polishing process has a thickness at least 20 μm thicker than a target thickness after the lapping process and the polishing process.

3. The method according to claim 2, wherein the load applied to the insert ranges from 100 to 300 g/cm².

4. The method according to claim 3, wherein, when the engaged insert is stuck and dried while the load is applied to the insert, the carrier body with which the insert is engaged is placed on a horizontal base, a weight is placed on the insert, and the horizontal base and the weight have a load surface with a flatness of 3 μm or less.

5. A method of double-side polishing wafers, comprising:
    preparing a plurality of carriers for use in a double-side polishing apparatus, the carriers being produced by the method according to claim 4;
    holding each of the wafers in a respective holding hole;
    disposing the carriers between upper and lower turn tables of the double-side polishing apparatus; and
    simultaneously double-side polishing the wafers.

6. A method of double-side polishing wafers, comprising:
    preparing a plurality of carriers for use in a double-side polishing apparatus, the carriers being produced by the method according to claim 3;
    holding each of the wafers in a respective holding hole;
    disposing the carriers between upper and lower turn tables of the double-side polishing apparatus; and
    simultaneously double-side polishing the wafers.

7. The method according to claim 2, wherein, when the engaged insert is stuck and dried while the load is applied to the insert, the carrier body with which the insert is engaged is placed on a horizontal base, a weight is placed on the insert, and the horizontal base and the weight have a load surface with a flatness of 3 μm or less.

8. A method of double-side polishing wafers, comprising:
    preparing a plurality of carriers for use in a double-side polishing apparatus, the carriers being produced by the method according to claim 7;
    holding each of the wafers in a respective holding hole;
    disposing the carriers between upper and lower turn tables of the double-side polishing apparatus; and
    simultaneously double-side polishing the wafers.

9. A method of double-side polishing wafers, comprising:
    preparing a plurality of carriers for use in a double-side polishing apparatus, the carriers being produced by the method according to claim 2;
    holding each of the wafers in a respective holding hole;
    disposing the carriers between upper and lower turn tables of the double-side polishing apparatus; and
    simultaneously double-side polishing the wafers.

10. The method according to claim 1, wherein the load applied to the insert ranges from 100 to 300 g/cm².

11. The method according to claim 10, wherein, when the engaged insert is stuck and dried while the load is applied to the insert, the carrier body with which the insert is engaged is placed on a horizontal base, a weight is placed on the insert, and the horizontal base and the weight have a load surface with a flatness of 3 μm or less.

12. A method of double-side polishing wafers, comprising:

preparing a plurality of carriers for use in a double-side polishing apparatus, the carriers being produced by the method according to claim 11;

holding each of the wafers in a respective holding hole;

disposing the carriers between upper and lower turn tables of the double-side polishing apparatus; and simultaneously double-side polishing the wafers.

13. A method of double-side polishing wafers, comprising:

preparing a plurality of carriers for use in a double-side polishing apparatus, the carriers being produced by the method according to claim 10;

holding each of the wafers in a respective holding hole;

disposing the carriers between upper and lower turn tables of the double-side polishing apparatus; and simultaneously double-side polishing the wafers.

14. The method according to claim 1, wherein, when the engaged insert is stuck and dried while the load is applied to the insert, the carrier body with which the insert is engaged is placed on a horizontal base, a weight is placed on the insert, and the horizontal base and the weight have a load surface with a flatness of 3 μm or less.

15. A method of double-side polishing wafers, comprising:

preparing a plurality of carriers for use in a double-side polishing apparatus, the carriers being produced by the method according to claim 14;

holding each of the wafers in a respective holding hole;

disposing the carriers between upper and lower turn tables of the double-side polishing apparatus; and simultaneously double-side polishing the wafers.

16. A method of double-side polishing wafers, comprising:

preparing a plurality of carriers for use in a double-side polishing apparatus, the carriers being produced by the method according to claim 1;

holding each of the wafers in a respective holding hole;

disposing the carriers between upper and lower turn tables of the double-side polishing apparatus; and simultaneously double-side polishing the wafers.

\* \* \* \* \*